US007106806B1

(12) United States Patent
Kenington (10) Patent No.: US 7,106,806 B1
(45) Date of Patent: Sep. 12, 2006

(54) REDUCING DISTORTION OF SIGNALS (75) Inventor: Peter Kenington, Chepstow (GB)

(73) Assignee: Andrew Corporation, Westchester, IL (US)

( * ) Notice: Subject to any disclaimer, the term of this patent is extended or adjusted under 35 U.S.C. 154(b) by 778 days.

(21) Appl. No.: 10/030,206

(22) PCT Filed: Jun. 27, 2000

(86) PCT No.: PCT/GB00/02464

§ 371 (c)(1),
(2), (4) Date: Dec. 31, 2001

(87) PCT Pub. No.: WO01/03287

PCT Pub. Date: Jan. 11, 2001

(30) Foreign Application Priority Data

Jun. 30, 1999 (GB) ................................. 9915255.5

(51) Int. Cl.
*H04K 1/02* (2006.01)
*H04L 25/03* (2006.01)
*H04L 25/49* (2006.01)
(52) U.S. Cl. ...................... 375/297; 330/278; 330/291; 330/295; 330/302; 702/86
(58) Field of Classification Search ................ 375/296, 375/297; 330/278, 279, 284, 294, 302, 291; 327/315; 702/86
See application file for complete search history.

(56) References Cited

U.S. PATENT DOCUMENTS

| 5,164,678 | A | | 11/1992 | Puri |
| 5,347,529 | A | | 9/1994 | Noe |
| 5,732,333 | A | * | 3/1998 | Cox et al. .................... 455/126 |
| 5,748,678 | A | * | 5/1998 | Valentine et al. ........... 375/297 |
| 5,760,646 | A | * | 6/1998 | Belcher et al. ............. 330/149 |
| 5,867,065 | A | * | 2/1999 | Leyendecker ............... 330/149 |

(Continued)

FOREIGN PATENT DOCUMENTS

DE 19 637 582 3/1998

(Continued)

OTHER PUBLICATIONS

Newton, "Newton's Telecom Dictionary". Ed 10th, 2004. p. 336.*

*Primary Examiner*—Temesghen Ghebretinsae
*Assistant Examiner*—Juan Alberto Torres
(74) *Attorney, Agent, or Firm*—Steve Mendelsohn (57) ABSTRACT

A predistorter (26) comprises an array (44) of band pass filters (46 to 52) which divide an input signal into components. Each of the components is manipulated using coefficients retrieved from respective look-up tables (54 to 60). The amplitude of each component is used to retrieve a coefficient from its respective look-up table. The amplitude of each component is then multiplied with its respective retrieved coefficient to generate a predistorted amplitude for that component. The predistorted amplitudes are summed (at 80) to produce a predistorted input signal. The predistortion of the input signal is arranged to counter the distortion characteristic of a signal handling element (such as non-linear power amplifier 22 in FIG. 1) to which the predistorted input signal is subsequently supplied. The coefficients in the look-up tables (54 to 60) can be adapted using feed back from the output of the signal handling means (FIG. 5). Fast Fourier transformation and inverse fast Fourier transformation can be used in place of band pass filter array (44) and combiner (80), respectively (FIG. 4).

22 Claims, 7 Drawing Sheets

U.S. PATENT DOCUMENTS

| | | | | |
|---|---|---|---|---|
| 5,892,397 A | * | 4/1999 | Belcher et al. | 330/297 |
| 6,104,239 A | * | 8/2000 | Jenkins | 330/2 |
| 6,216,100 B1 | * | 4/2001 | Meghdadi et al. | 703/15 |
| 6,591,234 B1 | * | 7/2003 | Chandran et al. | 704/225 |
| 6,614,854 B1 | * | 9/2003 | Chow et al. | 375/297 |
| 6,674,324 B1 | * | 1/2004 | Ocenasek et al. | 330/52 |
| 6,798,843 B1 | * | 9/2004 | Wright et al. | 375/296 |

FOREIGN PATENT DOCUMENTS

| | | |
|---|---|---|
| EP | 0 498 456 | 8/1992 |
| EP | 0 513 402 | 11/1992 |
| EP | 0 896 426 | 2/1999 |
| WO | WO 98/12800 | 3/1998 |
| WO | WO 99/22444 | 5/1999 |

* cited by examiner

REDUCING DISTORTION OF SIGNALS

FIELD OF THE INVENTION

This invention relates to a lineariser for reducing distortion of an output signal of signal handling means.

BACKGROUND OF THE INVENTION

The GSM-EDGE and UMTS standards place an increasingly stringent requirement on the linearity of handset transceiver circuits, particularly given the proposed wide channel band widths of handset transceivers compared to, for example, DAMPS and PDC systems. In order to realise a power efficient handset design, some form of linearisation will be required in the handset transceiver. This should be low power itself, capable of broadband linearisation (up to 5 MHz for UMTS/UTRA), frequency flexible, preferably multiband, and capable of achieving and maintaining high levels of linearity improvement when used to reduce distortion caused by highly non-linear power amplifiers (e.g. class-C amplifiers).

The use of conventional single channel linearisation schemes (e.g. Cartesian loop) suffer in that they are capable of controlling linearisation only over a finite gain-bandwidth. Such systems are not capable of providing the required linearity improvements ("gain") over the channel bandwidths envisaged (for UMTS, in particular).

Alternative broadband linearisation schemes, such as feed-forward arrangements, are difficult to implement as integrated circuits. They are also unable to attain desired levels of power efficiency because they employ additional linear amplifiers to perform distortion cancellation.

SUMMARY OF THE INVENTION

The trend in base station technology is towards the adoption of "software radio" techniques. That is, base station architectures in which all of the modulation parameters, ramping, framing etc. take place for all channels at baseband in the digital domain. The combination of all channels, at appropriate frequency offsets from one another, can also be performed at baseband and the whole channel spectrum up-converted to the transmission frequency in a single block for multi carrier power amplification and transmission from a single antenna.

According to one aspect, the invention provides a lineariser for reducing distortion of an output signal of signal handling means by processing a raw signal with data selected from storage means in response to the amplitude and frequency content of the raw signal. A lineariser of this type is versatile in that it can linearise, i.e. reduce distortion of, a signal which has experienced a distortion which varies with both amplitude and frequency. In addition, it is possible to adapt the data in the storage means so that the distortion reduction processing can be adapted to changes in the distortion.

The raw signal may be an input signal to the signal handling means. In this case, the lineariser functions as a predistorter which linearises the output of the signal handling means. Alternatively, the raw signal may be the output of the signal handling means. In this case, the lineariser functions as a post distorter of the output signal emerging from the signal handling means.

Preferably, the storage means comprises a group of look-up tables, each look-up table corresponding to a component of the raw signal having a different frequency or band of frequencies. Each of the look-up tables comprises a table of coefficients, each coefficient being associated with a value of the amplitude of the component of the table. Advantageously, coefficients can be interpolated for amplitude or frequency values which do not have an associated coefficient in the group of look-up tables.

In a preferred embodiment, the lineariser comprises dividing means for dividing the raw signal into a number of components having different frequencies or bands of frequencies. The components of the raw signal may then undergo distortion reduction processing separately. The dividing means can comprise a group of filters, each filter transmitting a different component of the raw signal. Alternatively, the dividing means can comprise means for transforming the raw signal from the time domain to the frequency domain to produce a spectrum of the amplitude of the raw signal against frequency. In a preferred embodiment, the transforming means calculates a Fourier transform of the raw signal.

The lineariser may also comprise means for combining components of the raw signal. In one embodiment, the combining means adds the components together. In another embodiment, the components are assembled into a frequency spectrum which is transformed to the time domain, preferably using an inverse Fourier transform technique.

Another advantage of the lineariser is that the data in the storage means may be altered to adapt distortion reduction processing to changes in the distortion. Preferably, therefore, the lineariser comprises means for adapting the data in the storage means to compensate for changes in the distortion characteristics of the signal handling means. Advantageously, the adapting means comprises means for monitoring feedback from the output of the signal handling means.

The lineariser can be used in conjunction with various kinds of distorting signal handling means, for example an amplifier and/or frequency converter. Their lineariser can be used on, or as part of, a transmitter which includes the distorting signal handling means.

According to a second aspect, the invention provides a method of reducing distortion of an output signal of signal handling means, said method comprising the steps of selecting data from storage means, in response to the amplitude and frequency content of a raw signal, and using the data in distortion reduction processing of the raw signal.

The above method may be used to reduce distortion of an output signal of signal handling means in a transmitter, so that the output of the transmitter is linearised.

BRIEF DESCRIPTION OF THE DRAWINGS

Certain embodiments of the invention will now be described, by way of example only, and with reference to the accompanying figures, in which.

DETAILED DESCRIPTION

Figure 1:
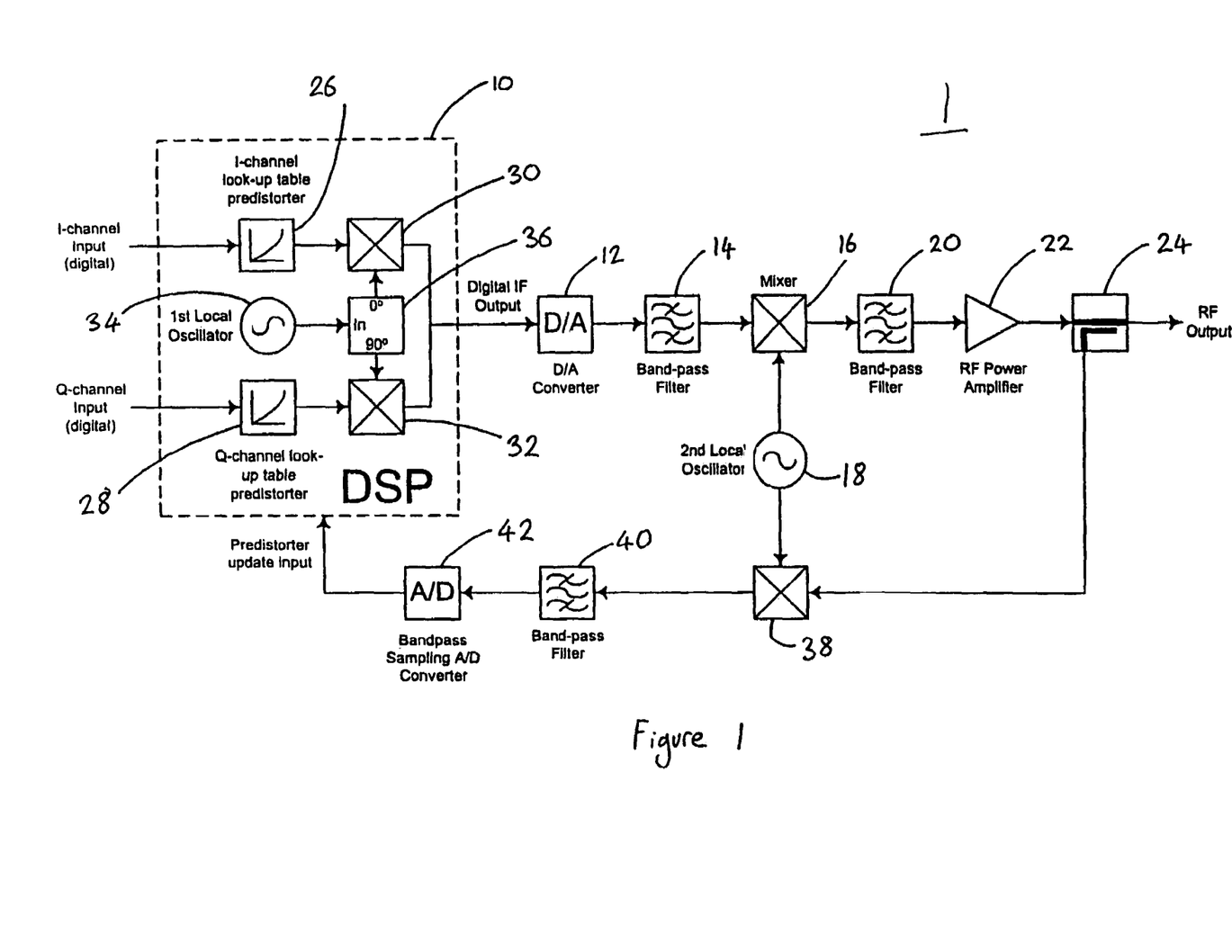
FIG. 1 is a block diagram of a digital transmitter.

With regard to FIG. 1, the transmitter, generally indicated 1, produces a radio frequency (RF) output from a baseband, digital input signal in quadtrature format. The quadrature input signal comprises an inphase channel input I and a quadrature channel input Q (phase displaced by 90° with respect to the I channel).

The transmitter 1 comprises a digital signal processor (DSP) 10 which receives the I and Q channels as inputs. The digital signal processor 10 predistorts the input signal (i.e. its I and Q components) and performs frequency up conversion of the predistorted input signal from the baseband to the intermediate frequency (IF) band. The DSP 10 supplies this digital IF band predistorted signal to a digital to analogue converter (DAC) 12 which supplies an analogue version of this signal to band pass filter 14. Mixer 16 combines the output of filter 14 with a signal from local oscillator 18 and produces an output spectrum which contains signals in a RF band destined for transmission. Band pass filter 20 receives the output spectrum of mixer 16 and selects the signals in the RF band which is to be used for transmission and passes them to non-linear power amplifier 22. The amplified output of the power amplifier 22 is output to an antenna for transmission. The output path to the antenna contains a splitter 24 for directing a portion of the amplified output along a feed back path to the DSP10 for adapting the applied predistortion (which will be described in detail later).

The predistortion of the input signal by DSP 10 counters the distortion caused by the non-linear power amplifier 22 (and also any distortion introduced during up conversion to the RF band) so that the output supplied to the antenna exhibits a low level of distortion. In other words, the output of the non-linear power amplifier 22 is linearised by the predistortion.

The DSP 10 comprises an I channel predistorter 26 and a Q channel predistorter 28 which receive the I and Q components of the input signal respectively. These predistorters 26 and 28 produce the necessary distortion of the input signal to counter distortion which is introduced downstream by the non-linear power amplifier 22. The predistorted versions of the I and Q channel inputs are supplied to respective mixers 30 and 32. The DSP 10 also comprises a local oscillator 34 which supplies a signal to a phase shifting element 36. The phase shifting element 36 supplies an inphase version of the signal from the local oscillator 34 to an input of mixer 30 and provides a quadrature version (i.e. phase displaced by 90° with respect to the inphase version) of the signal from local oscillator 34 to mixer 32. The mixers 30 and 32 produce outputs which are mixtures of their respective inputs, and these outputs are combined in the DSP 10 to produce the digital IF band predistorted output signal for conversion by DAC 12.

It is possible for the distortion caused by the non-linear power amplifier 22 to vary. For example, this can be due to ageing of the amplifier or changes in the environment in which it operates. Therefore, the DSP 10 is capable of adjusting the predistortions applied to the I and Q channel inputs by predistorters 26 and 28 to the varying non-linear character of the power amplifier 22. In order to adapt the predistorters 26 and 28 to the distortion produced by the power amplifier 22, the DSP 10 samples the linearised output of the power amplifier 22 through a feedback path connected to directional coupler 24. The feedback signal is frequency down converted by mixing it with a signal from local oscillator 18 at mixer 38. The output from this mixer is band pass filtered at 40 and supplied to analogue to digital converter (ADC) 42 which supplies a digital, down converted, IF band version of the feedback signal to the DSP 10 which is used to adjust the predistorters 26 and 28.

It will be apparent that the transmitter 1 can be embodied in a number of ways. The transmitter can take analogue I and Q channel inputs via ADCs at the inputs to the DSP 10. The transmitter 1 can be provided with an IF band input which is quadrature down converted (in the digital or analogue domain) to produce I and Q channel inputs for the DSP 10. Multi stage up conversion from the IF band to the RF band can be employed in place of the single stage process performed by mixer 16. An amplitude and phase polynomial format can be used for the input signal instead of the I and Q (Cartesian) format used in the transmitter of FIG. 1. Frequency conversion processes performed by the DSP 10 can instead be carried out in the analogue domain, if desired.

The predistorters 26 and 28 operate in substantially the same manner and therefore only the operation of the predistorter 26 in the I channel will now be described.

Figure 2:
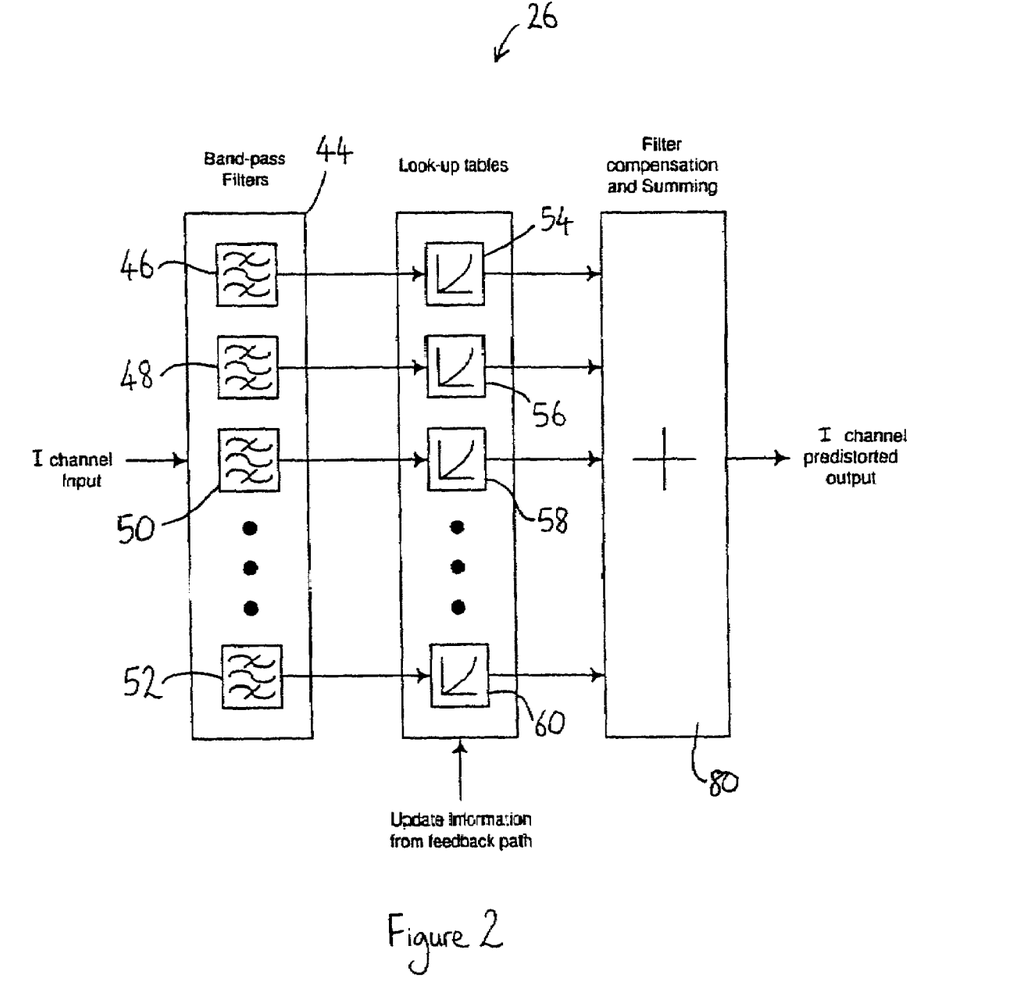
FIG. 2 is a block diagram of a filter based three dimensional look-up table predistorter.

The I channel predistorter 26 shown in FIG. 2 comprises an array 44 of band pass filters 46, 48, 50 and 52. The filters 46–52 are linear phased digital filters arranged such that the transmission function of each filter 46, 48, 50 and 52, passes a different frequency component of the I channel signal. The filter transmission functions are contoured such that their sum across the frequency width of the I channel gives an even, level transmission function across the whole width of the I channel. If it is desired to resolve the I channel signal into a greater number of frequency components than are provided by filters 46–52, this can be achieved by interpolating additional filters between those shown in FIG. 2.

The I channel predistorter 26 also comprises a group of look-up tables 54, 56, 58 and 60. Each of the components output by the group of filters 46 to 52 is associated with a respective look-up table 54 to 60. Each of the look-up tables has the same format (although, of course, they can each store different data) and hence only look-up table 54 associated with the output of filter 46 will now be described.

Look-up table 54 comprises a table of coefficients, each associated with a predetermined value of the amplitude of the I channel component provided by filter 46. The predistorter 26 retrieves the coefficient from the look-up table 54 which is associated with the present amplitude of the component output by filter 46. The predistorter 26 multiplies the amplitude of the component by the coefficient to produce a predistorted value of the component amplitude.

The predistorted amplitudes produced by the predistorter for the components passed by each filter 46 to 52 (by referring to the respective look-up tables 54 to 60) are summed by combiner 80 to produce a predistorted I channel signal. The Q channel predistorter 28 operates in a similar fashion and produces a predistorted Q channel signal. Predistorted I and Q channel signals are supplied to respective mixers 30 and 32 in DSP 10 (FIG. 1), the outputs of which are combined to create the IF band predistorted signal which is output from the DSP 10.

The input signals to the transmitter 1 are, of course, time varying and, consequently, so are the amplitudes of the components provided by array 44. Referring again to the component provided by filter 46, as its amplitude varies over time, predistorter 26 retrieves the coefficient from the look-up table 54 which corresponds to the new component amplitude. This coefficient is then multiplied with the new component amplitude to produce a new predistorted component amplitude. In other words, the predistorter 26 can vary the level of predistortion applied to the component from filter 46 in dependence on the amplitude of the component. If the component amplitude assumes a value for which no corresponding coefficient is stored in the look-up table 54, then the predistorter 26 can interpolate a suitable coefficient from the coefficients corresponding to component amplitudes adjacent to the current component amplitude. The interpolated coefficient can then be multiplied with the component amplitude in order to determine the predistorted amplitude.

It will be appreciated that if there is no look-up table corresponding to a certain frequency, then coefficient values for predistortion of amplitude values of a component having that frequency can be interpolated from look-up tables corresponding to, for example, components having adjacent frequencies.

Figure 3:
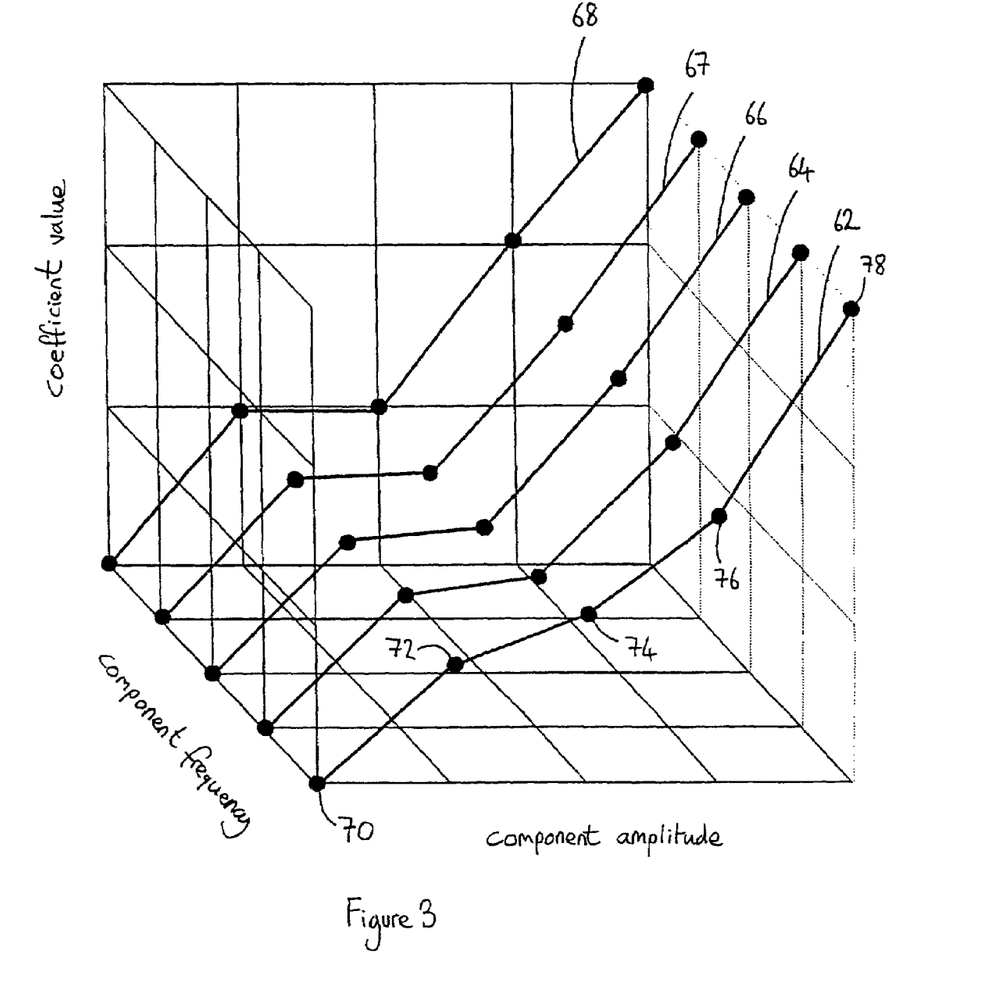
FIG. 3 illustrates a three dimensional look-up table.

The look-up tables 54 to 60 of predistorter 26 are represented graphically in FIG. 3. Each of the lines 62, 64, 66 and 68 represents a respective look-up table 54 to 60 of one of the frequency components passed by the filters 46 to 52. FIG. 3 also illustrates an additional line 67 which corresponds to a look-up table intermediate tables 58 and 60. When represented in the manner shown in FIG. 3, it is apparent that the group of look-up tables comprises a three dimensional look-up table, which plots coefficient values against component frequency and input component amplitude. Considering, for example, line 62 (which represents look-up table 54) which is associated with the component transmitted by filter 46, it will be noted that the coefficient values (the plotted points 70, 72, 74, 76 and 78) vary in dependence upon the component amplitude. The sections of line joining points 70 to 78 represent those coefficient values which are interpolated. It will also be noted, by comparing for example, lines 62 and 68 (corresponding to look-up tables 54 and 60), that the variation of the coefficient values with amplitude for the look-up tables of different components need not be the same. This permits the predistorters 26 and 28 of the transmitter scheme 1 to compensate for distortions which vary with frequency, leading to a more versatile linearising arrangement than a lineariser which operates on the assumption that the distortion undergoing compensation has no or neglible frequency dependence (i.e. linearisers of the type which assume that the distortion is "frequency flat").

Another embodiment of the predistortion process will now be described by reference to FIG. 4. Again, the I and Q channel predistorters operate in the same manner and hence only the operation of the I channel predistorter will now be described. Whereas the predistorters of the previous embodiment used groups of filters to divide the input signal into components, the predistorters according to this embodiment transfer the time varying input signals to the frequency domain by Fourier transformation.

Figure 4:
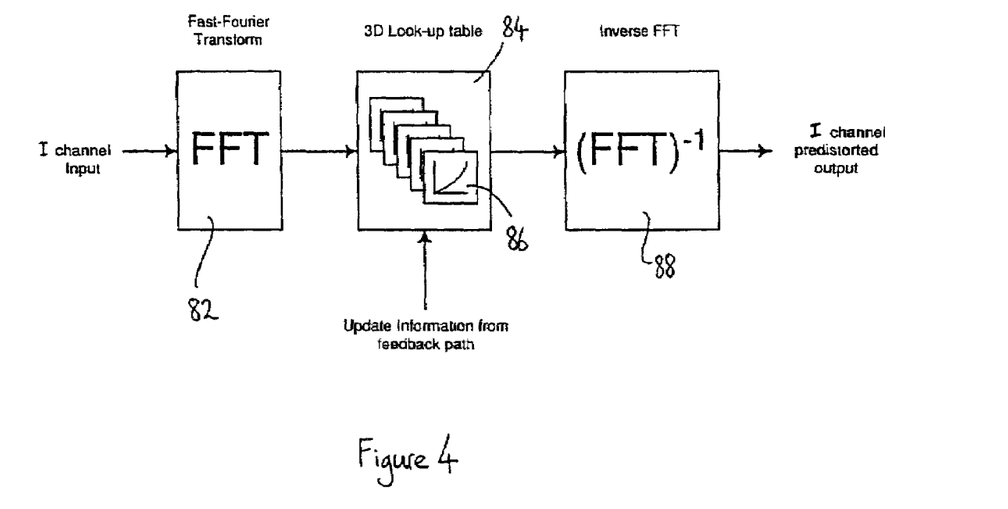
FIG. 4 is a block diagram of a fast fourier transformation (FFT) based three dimensional look-up table predistorter.

With reference to FIG. 4, the I channel predistorter receives the I channel signal and transforms it to the amplitude versus frequency domain by using the fast Fourier transformation (FFT) process which yields a time varying spectrum of amplitude plotted against frequency for the I channel signal. The FFT process is indicated 82 in FIG. 4. The predistorter segments, i.e. divides, the spectrum into frequency components. As before, the predistorter contains a group of look-up tables, 84, one corresponding to each component of the spectrum. The predistorter manipulates each component of the spectrum in a similar manner to the others, by reference to their matched look-up tables 84. Hence, only the predistortion of one of the components will now be described.

Look-up table 86 comprises a table of coefficients, each of which is associated with a predetermined component amplitude. The predistorter retrieves from look-up table 86 the coefficient corresponding to the present amplitude of the component associated with that look-up table and multiples the coefficient with the present component amplitude to generate a predistorted amplitude. The process of creating predistorted component amplitudes by reference to coefficients stored in look-up tables 84 is similar to that employed in the embodiment previously described. Interpolation is used to deduce coefficient values for component amplitudes which do not have a matched coefficient in a look-up table.

The predistorter produces a predistorted component amplitude for each of the components of the Fourier transformed spectrum and then reassembles the frequency spectrum which now has predistorted amplitudes. The reassembled frequency spectrum then undergoes, at 88, inverse fast Fourier transformation (FFT$^{-1}$) to transform it back to an amplitude versus time signal in the time domain. This signal is the predistorted I channel signal.

The Q channel predistorter generates the predistorted Q channel signal in the same manner. The predistorted I and Q signals are then mixed with I and Q signals derived from local oscillator 34 (FIG. 1) respectively to produce two signals which are combined to create the IF band predistorted output of the DSP 10.

An advantage gained by the two above described embodiments through the use of look-up tables is that the predistorter can be adapted easily to changes in the character of the distortion produced by the power amplifier 22 (e.g. due to ageing of the amplifier or changes in environmental conditions such as temperature, etc.). The coefficients in the look-up tables can be changed by the DSP 10 to make appropriate adjustments to the predistortion to track changes in the distortion character of the non-linear power amplifier 22. The necessary changes to the coefficients are determined by monitoring the output of the power amplifier 22 via the feedback path from splitter 24 in FIG. 1. The process of adapting predistorter coefficients will now be described with reference to FIG. 5.

Figure 5:
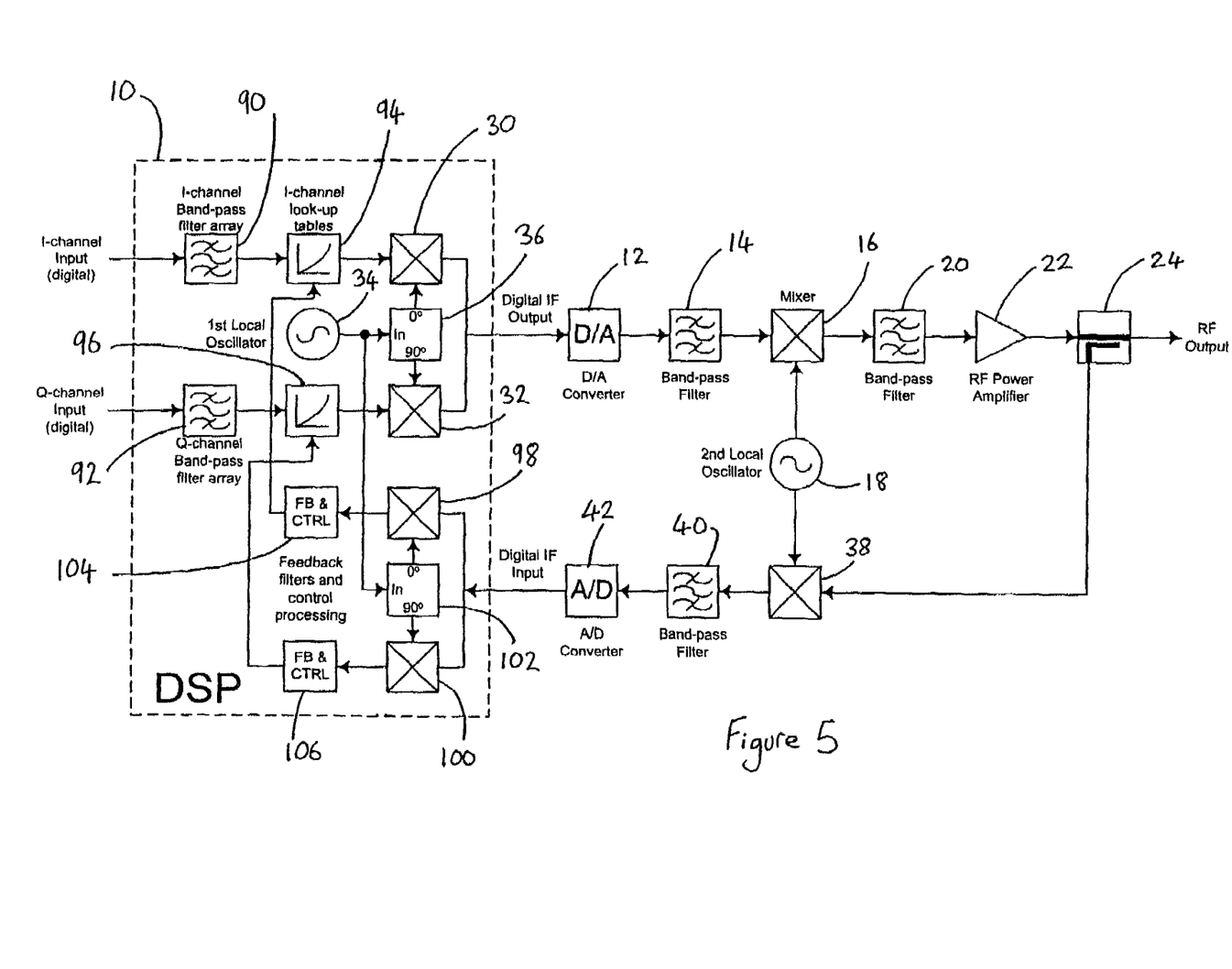
FIG. 5 is a block diagram of a digital transmitter illustrating its feedback scheme in detail.

FIG. 5 is a more detailed diagram of a transmitter employing look-up table based I and Q channel predistorters which each operate using the filter based approach previously described with reference to FIG. 2. Elements in FIG. 5 which have already been described retain the same reference numerals. In the figure, the I and Q predistorters are shown in slightly more detail than in FIG. 1. The figure illustrates the groups 90 and 92 of band pass filters which divide the I and Q channel input signals respectively into components, and also illustrates the groups of look-up tables 94 and 96 forming part of the I and Q channel predistorters respectively. As described previously with reference to FIG. 2, the I and Q channel predistorters operate in substantially the same manner. Briefly, and considering only the I channel predistorter (the operation of the Q channel predistorter being similar), the filter group 90 divides the I channel input signal into a group of components each having a different frequency. The amplitude of each of these components is then used to retrieve a coefficient from the look-up table in group 94 which corresponds to that component. If coefficients cannot be located in the look-up table group 94, they can be interpolated. The retrieved coefficients are then multiplied with the amplitude of their respective components to produce predistorted component amplitudes. These predistorted amplitudes are then summed and provided as the predistorted I channel signal to mixer 30 which performs part of the frequency conversion process to IF band. Similarly, the Q channel predistorter produces a predistorted Q channel input signal to mixer 32.

FIG. 5 also shows the feedback adaption mechanism within the DSP 10. The digital IF band feedback signal produced by ADC 42 is frequency down converted to create a base band signal in quadrature format. The output of ADC 42 is supplied to an input of each of mixers 98 and 100. The output of the local oscillator 34 (which is also used in the frequency up conversion of the predistorted I and Q input signals) is supplied to phase shifting element 102 which generates inphase and quadrature shifted versions of the signal from the local oscillator. The inphase version of this signal is mixed with the output of ADC 42 at mixer 98 to produce an I channel feedback signal which is used by feedback and control mechanism 104 in the adaption of the coefficients of the look-up tables in group 94. The quadrature shifted signal produced by phase shifting element 102 is mixed into the output of ADC 42 at mixer 100 to produce a quadrature channel feedback signal which is used by feedback and control mechanism 106 in the adaption of the coefficients of the look up tables in group 96.

With regard to the FFT based scheme described with reference to FIG. 4, the feedback processing and look-up table adaption process is as described in FIG. 5. To adapt FIG. 5 to illustrate the FFT based scheme, band pass filter arrays 90 and 92 would each be replaced by a FFT process, each arranged to output a segmented spectrum. The look-up table groups 94 and 96 would then each be followed by an inverse fast Fourier transformation process converting the respective predistorted spectra to the time domain for subsequent frequency up conversion using the signal from local oscillator 34.

The feedback and control mechanisms 104 and 106 will now be described in more detail for the filter based scheme by reference to FIG. 6, and for the FFT based scheme with reference to FIG. 7.

Figure 6:
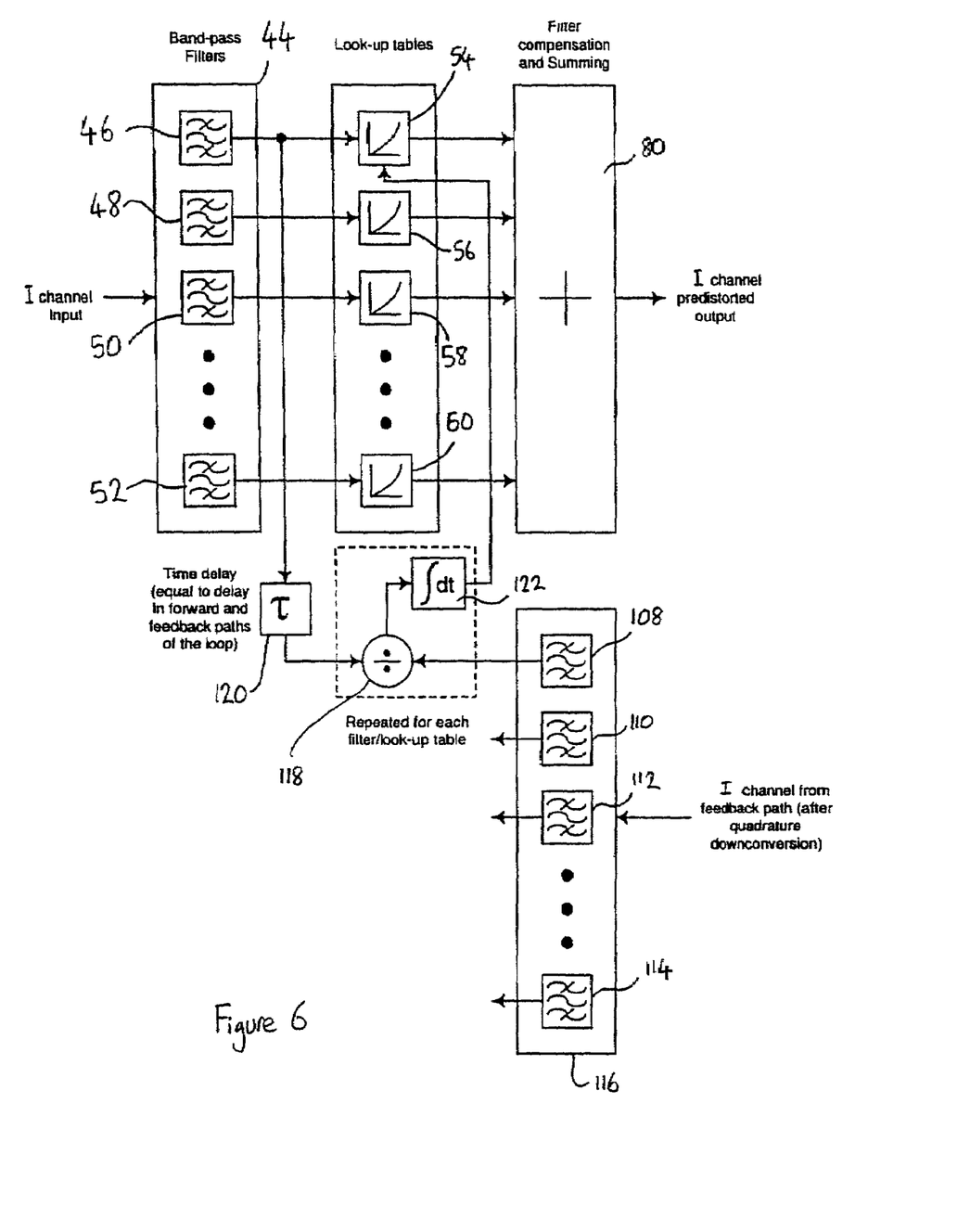
FIG. 6 is a block diagram illustrating a feed back control mechanism for updating look-up tables of a filter based predistorter.
Figure 7:
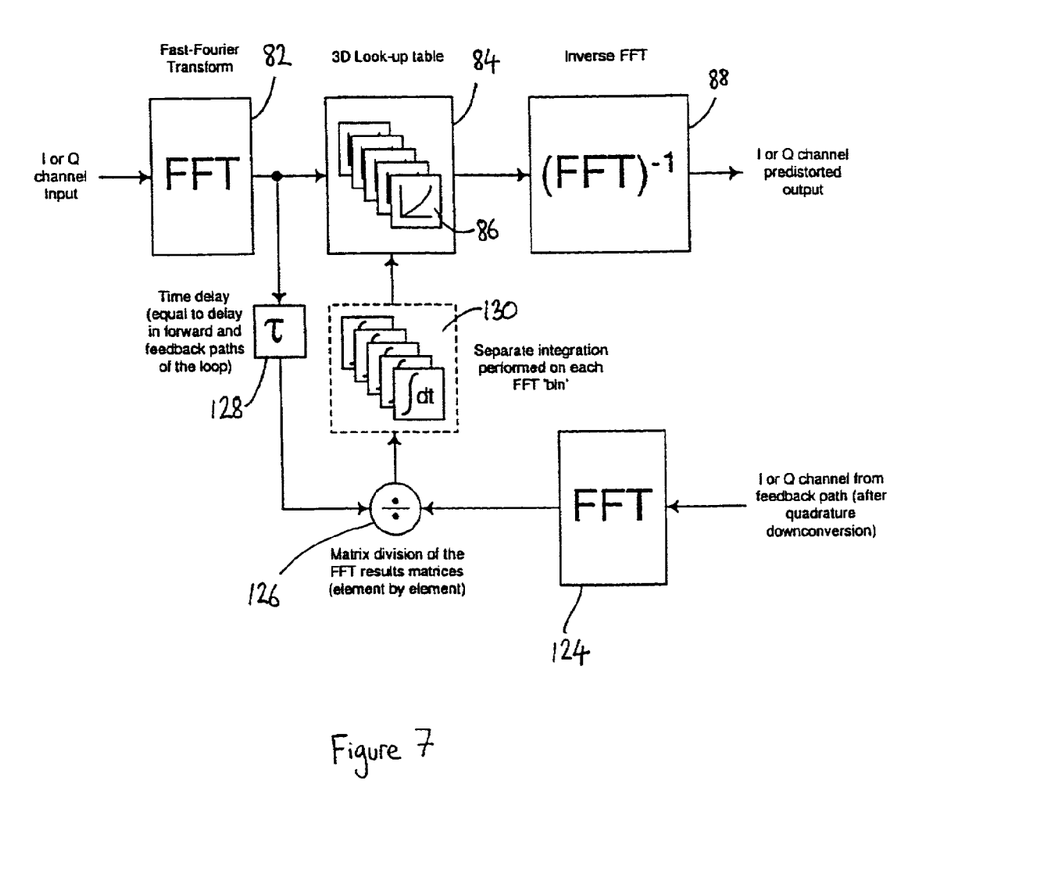
FIG. 7 is a block diagram illustrating a feed back control mechanism for updating look-up tables of a FFT based predistorter.

FIG. 6 illustrates the I channel predistortion process (elements appearing in FIG. 2 retain the same reference numerals) and, in more detail, the feedback and control mechanism 104. It will be appreciated that there is an analogous arrangement for the Q channel.

The I channel base band feedback signal is divided into components having different frequencies by band pass filters 108, 110, 112 and 114 of array 116. The transmission functions of filters 108 to 114 correspond, respectively, to those of filters 46 to 52. The components of the feedback signal transmitted by the filters of array 116 are each used, in a separate process, to adapt the coefficients stored in a respective look-up table. For clarity, FIG. 6 illustrates only the process by which look-up table 54 is adapted. It will be apparent that a similar process occurs for each feedback component produced by array 116 and its matched input component from array 44.

The feedback component from filter 108 and the input component from filter 46 are supplied to divider 118. The input component from filter 46 is delayed by a time delay element 120 to compensate for the time taken for signals to travel through the predistorter and amplifier 22 and back via the feedback path.

Integrator 122 produces a signal which is then used to modify the coefficients of look-up table 54. This modification ensures that the loop gain equals a predetermined constant, GL, which is the same for all input samples and all look-up tables 54 to 60. An appropriate offset, $K_O$, is subtracted within the integrator to ensure that the overall loop gain including the predistorter and all elements of the feedback up to the divider equals an appropriate constant, in this case $K_O$ is equal to 1. The output of the integrator 122 is arranged to be added to the existing value of the look-up table coefficient currently indexed, i.e. specified, by the value of the component amplitude supplied from delay element 120. In an alternative embodiment, the output of the integrator is instead multiplied with the existing look-up table coefficient. The integrator based approach has the advantage, compared to a direct calculation approach, that a degree of averaging is provided which acts to reduce spurious updates. However, it will operate at a lower speed than a direct calculation approach.

To implement a direct calculation approach in the feedback and control mechanism, the output of divider 118 can be arranged to result directly in a factor by which the existing coefficient must be multiplied in order to generate the new estimate of the value of the coefficient. Mathematical averaging may also be applied to the new estimated values in order to reduce spurious updates. The resulting factor value will either be greater or less than unity depending on the direction of the error of the coefficient in question.

The feedback and look-up table adaption process for the FFT based approach will now be described in more detail with reference to FIG. 7. Again, elements appearing in FIG. 4 retain the same reference numerals. FIG. 7 illustrates the I channel FFT based predistorter and, in more detail, the feedback and control mechanism 104.

The output from mixer 98 in FIG. 5 undergoes fast Fourier transformation at 124 to produce a frequency spectrum of the I channel feedback signal which is segmented into components (also known as "bins"). The segmented frequency spectra of the I channel input and feedback signals are supplied to divider 126. The frequency spectrum of the I channel input signal reaches the divider 126 by way of a delay element 128 which compensates for the delay incurred by the input signal passing through the predistorter and the amplifier 22, and returning via the feedback path to divider 126. Divider 126 outputs a signal corresponding to each matched pair of segments of the input and feedback spectra. Each of these outputs is integrated separately at 130 to produce output signals which are used to adapt coefficients in the individual look-up tables. The coefficients to be adapted are indexed by amplitude values of the delayed spectrum segments issued from element 128. This integrator based approach to adapting the look-up table coefficients operates in a similar manner to that described with reference to FIG. 6. Furthermore, again as described with reference to FIG. 6, the update mechanism of FIG. 7 can also use a direct calculation approach to adapting the look-up table coefficients.

The invention claimed is:

1. A lineariser for reducing distortion of an output signal of signal handling equipment, the lineariser comprising:
   a divider adapted to divide a raw signal into a plurality of parallel components having different frequencies or bands of frequencies; and
   means for processing each component of the raw signal with data selected from a store in response to the amplitude and frequency content of the raw signal, to reduce said distortion, wherein the store comprises a group of look-up tables, each table corresponding to a component of the raw signal having a different frequency or band of frequencies, and each table comprising a table of coefficients, each coefficient associated with a value of the amplitude of the component of the table.

2. A method of reducing distortion of an output signal of signal handling equipment, said method comprising the steps of:

dividing the raw signal into a plurality of parallel components having different frequencies or bands of frequencies, selecting data from a store in response to the amplitude and frequency content of the raw signal, and using the data in distortion reduction processing of the raw signal, wherein the store comprises a group of look-up tables, each table corresponding to a component of the raw signal having a different frequency or band of frequencies, and each table comprising a table of coefficients, each coefficient associated with a value of the amplitude of the component of the table.

3. A method for reducing distortion in an output signal generated by signal handling equipment, the method comprising:

(a) dividing a raw signal into a plurality of parallel raw components, each raw component having an amplitude and each raw component corresponding to a different frequency or band of frequencies;

(b) generating a modified component for each raw component based on the amplitude of the raw component by retrieving, for each raw component, a value for the corresponding modified component from a look-up table (LUT) based on the amplitude of the raw component, wherein each different frequency or band of frequencies has its own LUT; and (c) combining the plurality of modified components to generate a modified signal, wherein:

the signal handling equipment is an amplifier adapted to amplify the modified signal; and the modified signal is generated by applying pre-distortion to the raw signal, wherein the pre-distortion reduces the distortion in the output signal generated by the amplifier.

4. The invention of claim 3, wherein:

step (a) comprises applying different copies of the raw signal to a plurality of band-pass filters to generate the plurality of raw components, each band-pass filter corresponding to a different frequency or band of frequencies; and step (c) comprises summing the plurality of modified components to generate the modified signal.

5. The invention of claim 3, wherein:

step (a) comprises transforming the raw signal from a time domain to a frequency domain to generate the plurality of raw components; and step (c) comprises transforming the plurality of modified components from the frequency domain to the time domain to generate the modified signal.

6. The invention of claim 3, further comprising (d) adaptively updating values stored in each LUT.

7. The invention of claim 6, wherein step (d) comprises:

(1) generating a feedback signal based on the output signal of the signal handling equipment;

(2) dividing the feedback signal into a plurality of feedback components, each feedback component corresponding to a different frequency or band of frequencies;

(3) generating, for each frequency or band of frequencies, an update value for the corresponding LUT based on the corresponding raw component and the corresponding feedback component; and (4) updating each LUT based on the corresponding update value.

8. The invention of claim 7, wherein step (d)(3) comprises applying the corresponding raw component and the corresponding feedback component to a divider to generate the corresponding update value.

9. The invention of claim 8, wherein step (d)(3) further comprises integrating, over time, outputs from the divider to generate the corresponding update value.

10. An apparatus for reducing distortion in an output signal generated by signal handling equipment, the apparatus comprising:

(a) means for dividing a raw signal into a plurality of parallel raw components, each raw component having an amplitude and each raw component corresponding to a different frequency or band of frequencies;

(b) means for generating a modified component for each raw component based on the amplitude of the raw component, wherein:

means (b) comprises a plurality of LUTs;

each LUT corresponds to a different frequency or band of frequencies; and each LUT is adapted to provide, for the corresponding raw component, a value for the corresponding modified component based on the amplitude of the raw component; and (c) means for combining the plurality of modified components to generate a modified signal, wherein:

the signal handling equipment is an amplifier adapted to amplify the modified signal; and the modified signal is generated by applying pre-distortion to the raw signal, wherein the pre-distortion reduces the distortion in the output signal generated by the amplifier.

11. The invention of claim 10, wherein:

means (a) comprises a plurality of band-pass filters connected to receive different copies of the raw signal and adapted to generate the plurality of raw components, each band-pass filter corresponding to a different frequency or band of frequencies; and means (c) comprises a combiner adapted to sum the plurality of modified components to generate the modified signal.

12. The invention of claim 10, wherein:

means (a) comprises a transform adapted to transform the raw signal from a time domain to a frequency domain to generate the plurality of raw components; and means (c) comprises an inverse transform adapted to transform the plurality of modified components from the frequency domain to the time domain to generate the modified signal.

13. The invention of claim 10, further comprising (d) means for adaptively updating values stored in each LUT.

14. The invention of claim 13, wherein means (d) comprises:

(1) means for generating a feedback signal based on the output signal of the signal handling equipment;

(2) means for dividing the feedback signal into a plurality of feedback components, each feedback component corresponding to a different frequency or band of frequencies;

(3) a feedback and control mechanism adapted to generate, for each frequency or band of frequencies, an update value for the corresponding LUT based on the corresponding raw component and the corresponding feedback component; and (4) means for updating each LUT based on the corresponding update value.

15. The invention of claim 14, wherein the feedback and control mechanism comprises a divider adapted to receive the corresponding raw component and the corresponding feedback component to generate the corresponding update value.

16. The invention of claim 15, wherein the feedback and control mechanism further comprises an integrator adapted to integrate, over time, outputs from the divider to generate the corresponding update value.

17. A method for reducing distortion in an output signal generated by signal handling equipment, the method comprising:
- (a) dividing a raw signal into a plurality of raw components, each raw component having an amplitude and each raw component corresponding to a different frequency or band of frequencies;
- (b) generating a modified component for each raw component based on the amplitude of the raw component by retrieving, for each raw component, a value for the corresponding modified component from a look-up table (LUT) based on the amplitude of the raw component, wherein each different frequency or band of frequencies has its own LUT;
- (c) combining the plurality of modified components to generate a modified signal;
- (d) generating a feedback signal based on the output signal of the signal handling equipment;
- (e) dividing the feedback signal into a plurality of feedback components, each feedback component corresponding to a different frequency or band of frequencies;
- (f) generating, for each frequency or band of frequencies, an update value for the corresponding LUT by applying the corresponding raw component and the corresponding feedback component to a divider; and
- (g) updating each LUT based on the corresponding update value.

18. The invention of claim 17, wherein:
the signal handling equipment is an amplifier adapted to amplify the modified signal; and
the modified signal is generated by applying pre-distortion to the raw signal, wherein the pre-distortion reduces the distortion in the output signal generated by the amplifier.

19. The invention of claim 17, wherein step (d)(3) further comprises integrating, over time, outputs from the divider to generate the corresponding update value.

20. An apparatus for reducing distortion in an output signal generated by signal handling equipment, the apparatus comprising:
- (a) means for dividing a raw signal into a plurality of raw components, each raw component having an amplitude and each raw component corresponding to a different frequency or band of frequencies;
- (b) means for generating a modified component for each raw component based on the amplitude of the raw component by retrieving, for each raw component, a value for the corresponding modified component from a look-up table (LUT) based on the amplitude of the raw component, wherein each different frequency or band of frequencies has its own LUT;
- (c) means for combining the plurality of modified components to generate a modified signal;
- (d) means for generating a feedback signal based on the output signal of the signal handling equipment;
- (e) means for dividing the feedback signal into a plurality of feedback components, each feedback component corresponding to a different frequency or band of frequencies;
- (f) means for generating, for each frequency or band of frequencies, an update value for the corresponding LUT by applying the corresponding raw component and the corresponding feedback component to a divider; and
- (g) means for updating each LUT based on the corresponding update value.

21. The invention of claim 20, wherein:
the signal handling equipment is an amplifier adapted to amplify the modified signal; and
the modified signal is generated by applying pre-distortion to the raw signal, wherein the pre-distortion reduces the distortion in the output signal generated by the amplifier.

22. The invention of claim 20, wherein the feedback and control mechanism further comprises an integrator adapted to integrate, over time, outputs from the divider to generate the corresponding update value.

* * * * *